(12) United States Patent
Butter

(10) Patent No.: US 7,752,592 B2
(45) Date of Patent: Jul. 6, 2010

(54) SCHEDULER DESIGN TO OPTIMIZE SYSTEM PERFORMANCE USING CONFIGURABLE ACCELERATION ENGINES

(75) Inventor: Adrian S. Butter, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 11/869,823

(22) Filed: Oct. 10, 2007

(65) Prior Publication Data

US 2009/0096481 A1    Apr. 16, 2009

(51) Int. Cl.
*G06F 17/50*     (2006.01)
*G06F 9/00*      (2006.01)
*G06F 15/177*    (2006.01)
*H03K 19/177*    (2006.01)

(52) U.S. Cl. ............................... 716/17; 716/16; 716/8; 713/2; 713/100; 326/38; 326/41; 326/47

(58) Field of Classification Search ................... 716/16, 716/17, 8; 713/2, 100; 326/38, 41, 47
See application file for complete search history.

(56) References Cited

U.S. PATENT DOCUMENTS

| | | | |
|---|---|---|---|
| 6,526,559 B2 * | 2/2003 | Schiefele et al. | 716/16 |
| 7,640,342 B1 * | 12/2009 | Aharoni et al. | 709/226 |
| 2004/0139311 A1 * | 7/2004 | Garey | 713/100 |
| 2005/0240757 A1 * | 10/2005 | Sato | 713/100 |

* cited by examiner

*Primary Examiner*—Phallaka Kik
(74) *Attorney, Agent, or Firm*—Cantor Colburn, LLP

(57) ABSTRACT

A reusable hardware control structure is provided for a hardware acceleration engine that can be configured for implementation within an electronic integrated circuit design according to any one of a plurality of configuration alternatives. The reusable hardware control structure comprises a digital logic circuit design developed to receive configuration data from the hardware acceleration engine describing a selected configuration alternative. The selected configuration alternative is any one of the plurality of configuration alternatives. The digital logic circuit design is developed to process the configuration data to provide an evaluation of an input-to-output latency and an input blocking pattern of the hardware acceleration engine configured according to the selected configuration alternative. The evaluation is capable of being leveraged by control logic within the electronic integrated circuit design to increase utilization of the hardware acceleration engine.

20 Claims, 7 Drawing Sheets

SCHEDULER DESIGN TO OPTIMIZE SYSTEM PERFORMANCE USING CONFIGURABLE ACCELERATION ENGINES

BACKGROUND OF THE INVENTION

1. Field of the Invention

Exemplary embodiments of the present invention relate to hardware accelerators, and more particularly, to control structures for configurable hardware acceleration engines.

2. Description of Background

Normally, computer processing units are sequential, and instructions are executed one by one. Hardware acceleration, which involves the use of hardware components to perform one or more functions more efficiently than in software running on a normal processing system, is one of various techniques used to improve performance. A difference between hardware and software is concurrency, which allows hardware to perform functions faster than software. The hardware that performs the acceleration, when in a separate, supplementing unit from the CPU, is referred to as a hardware accelerator.

Hardware accelerators are typically designed for computationally intensive operations such as, for example, floating point arithmetic, graphics, signal processing, string processing, or encryption. By offloading processor-intensive tasks from the main processor, system performance can be accelerated. Examples of hardware accelerators include cryptographic engines, vector and graphics processors, Discrete Cosine Transform (DCT), Inverse Discrete Cosine Transform (IDCT) functions for MPEG encoders and decoders, and other components providing for acceleration of the execution of instructions for complex operations on processing systems. Depending upon granularity, hardware accelerators can vary from special-purpose units to large functional blocks such as, for example, those designed for motion estimation in MPEG2.

A common configuration for high-volume, embedded hardware systems is the system on a chip (SoC) design, which integrates all components of a processing system into a single circuit or chip to increase data throughput for computationally intensive operations, thereby increasing overall system performance. Typically, SoCs are developed from pre-qualified blocks of hardware elements, together with software drivers that control their operation. In order to simplify the SoC design task, application specific integrated circuit (ASIC) vendors typically offer a menu of pre-defined functional building blocks called "cores" that can be embedded within an SoC. A core is a reusable unit of logic, cell, or chip layout design that is dedicated to a single function, or a limited range or functions, and may be owned and used by a single party alone or licensed to other parties.

Typically, a designer will have a number of available approaches in designing ASIC cores that involve tradeoffs between physical size (usually expressed as the area or cell count consumed on the SoC), performance (usually expressed as the clock rate in cycles per second at which a processor performs its most basic operations), latency (usually expressed as the number of clock cycles or total time elapsed between when a data input is provided to the accelerator and when the input is processed accordingly and the corresponding data output is available from the accelerator), and overall throughput (usually expressed as the number of bits or bytes processed per second). The "optimal" design approach in terms of these tradeoffs is determined by the requirements for a given application. For example, in cost-sensitive consumer applications (such as PDAs, cell phones, etc.), minimizing physical size is typically a primary concern, while for high performance applications (such as transaction processing for banking, real-time video and image processing for Aerospace & Defense systems, etc.), minimizing latency and maximizing overall throughput typically take priority.

Special-purpose hardware accelerators are often integrated within ASIC cores in SoC designs. A primary objective in developing an ASIC core is to make it as usable as possible across a broad range of applications and technologies. For ASIC cores that incorporate hardware accelerators, however, achieving this objective becomes complex due to the often-conflicting design-tradeoff priorities across applications as outlined above. One approach to facilitate broad usage for such cores is to make their designs configurable. For example, in designing cores that integrate configurable hardware accelerators that perform the same calculations repeatedly on each data input to generate the corresponding data output (such as cryptographic engines), it is feasible to define configuration options that can be invoked at hardware compile time to optimize design characteristics such as physical size, performance, latency, and overall throughput based on particular application requirements. Accordingly, it is desirable to implement a reusable control structure within a core integrating a configurable hardware acceleration engine that is able to provide for the available acceleration engine configuration options to be leveraged in such a flexible and optimized manner.

SUMMARY OF THE INVENTION

The shortcomings of the prior art can be overcome and additional advantages can be provided through exemplary embodiments of the present invention that are related to a reusable hardware control structure for a hardware acceleration engine that can be configured for implementation within an electronic integrated circuit design according to any one of a plurality of configuration alternatives. The reusable hardware control structure comprises a digital logic circuit design developed to receive configuration data from the hardware acceleration engine describing a selected configuration alternative. The selected configuration alternative is any one of the plurality of configuration alternatives. The digital logic circuit design is developed to process the configuration data to provide an evaluation of an input-to-output latency and an input blocking pattern of the hardware acceleration engine configured according to the selected configuration alternative. The evaluation is capable of being leveraged by control logic within the electronic integrated circuit design to increase utilization of the hardware acceleration engine.

The shortcomings of the prior art can also be overcome and additional advantages can also be provided through exemplary embodiments of the present invention that are related to a method that can be performed by the above-summarized exemplary embodiments related to a reusable hardware control structure are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a solution that can be implemented to provide a reusable control structure within an integrated circuit core integrating a configurable hardware acceleration engine that is able to provide for the available acceleration engine configuration alternatives to be selected to meet a desired design characteristic tradeoff for a particular application and leveraged in a flexible and optimized manner.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description of exemplary embodiments of the present invention taken in conjunction with the accompanying drawings in which:

Figure 1:
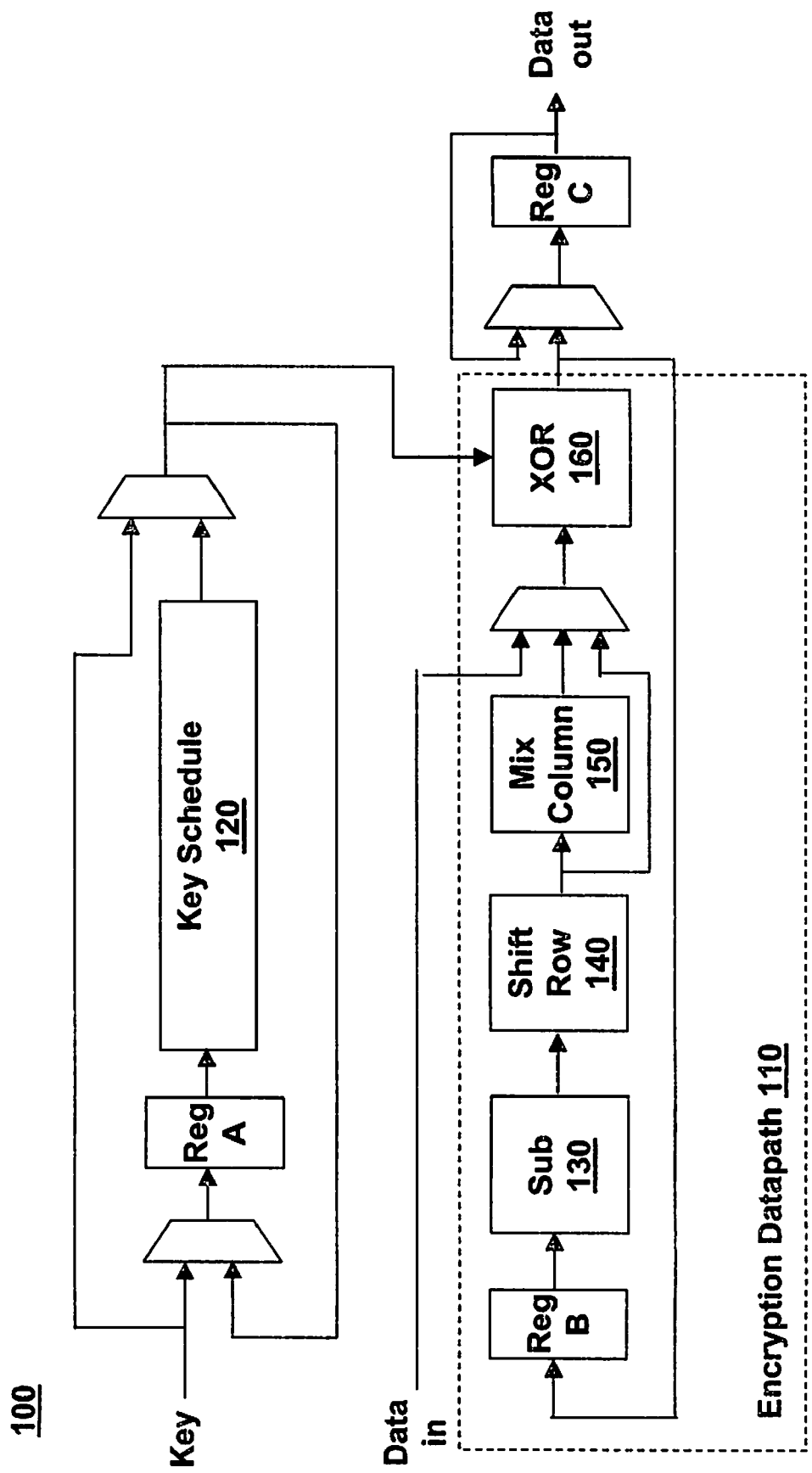
FIG. 1 is a block diagram illustrating the architecture of an exemplary AES cryptographic engine core.

The detailed description explains exemplary embodiments of the present invention, together with advantages and features, by way of example with reference to the drawings. There may be many variations to these diagrams or the components (or operations) described therein without departing from the spirit of the invention. For instance, the steps may be performed in a differing order, or components or steps may be added, deleted, or modified. All of these variations are considered a part of the claimed invention.

DETAILED DESCRIPTION OF EXEMPLARY EMBODIMENTS

While the specification concludes with claims defining the features of the invention that are regarded as novel, it is believed that the invention will be better understood from a consideration of the description of exemplary embodiments in conjunction with the drawings. It is of course to be understood that the embodiments described herein are merely exemplary of the invention, which can be embodied in various forms. Therefore, specific structural and functional details disclosed in relation to the exemplary embodiments described herein are not to be interpreted as limiting, but merely as a representative basis for teaching one skilled in the art to variously employ the present invention in virtually any appropriate form. Further, the terms and phrases used herein are not intended to be limiting but rather to provide an understandable description of the invention.

Exemplary embodiments of the present invention disclosed herein are directed to the implementation of a reusable control structure for a core logic circuit, cell, or chip layout design that can be used to optimize design characteristics for any configuration of one (or more) configurable hardware acceleration engine(s) that is (are) integrated into an integrated circuit (IC) core such as an ASIC core. Exemplary embodiments can be developed to ultimately save time and cost by providing an evaluation of any configuration for a given hardware accelerator that can be leveraged by control logic to increase utilization of the hardware accelerator. Exemplary embodiments of the present invention can be implemented by performing an evaluation of the key design characteristics for any configuration of one (or more) configurable acceleration engine(s) selected to provide for a desired design tradeoff as determined by the requirements of a particular application, and thereafter translating that evaluation into a set of design parameters for the reusable control structure in a flexible manner based on the requirements of a particular application.

In exemplary embodiments described herein, a reusable control structure that can be incorporated into programmable logic of core layout designs to achieve one or more objectives of the present invention is termed the "scheduler." The scheduler control structure can be designed to leverage the available configuration options of a given hardware acceleration engine in a flexible manner so as to optimize physical size, performance, latency, and overall throughput based on particular application requirements. The scheduler control structure can interpret acceleration engine configuration options that are fixed at hardware compile provide support for different design tradeoffs for a wide range of applications. In exemplary embodiments, the scheduler control structure is provided in the form of ASIC core functionality and interfaces with an acceleration engine that can be configured according to the designer's input to suit a particular application.

In implementing exemplary embodiments of a scheduler control structure, an evaluation of the following characteristics is first performed across the configuration space for a given hardware accelerator: (a) input to output latency pertaining to a given data input to the accelerator (expressed as the number of clock cycles or total time elapsed between when a data input is provided to the accelerator and when the corresponding data output is available from the accelerator); and (b) the blocking pattern for future data inputs to the accelerator while the accelerator is processing a given data input. Because acceleration engines comprise digital circuits usually pipelined into semi-independent component pipeline stages that are synchronized by a clock signal and the processing of successive data inputs in a sequence can thereby be partially overlapped, a blocking pattern occurs in a given acceleration engine that identifies pipeline stage conflicts between successive data inputs and intermediate results generated from prior data input processing operations during the same clock cycle. In such pipeline stage conflict scenarios, the scheduler control structure should be implemented to block new data inputs until the required pipeline stage becomes available after processing a given intermediate result. That is, as each new data input is ready for processing by the acceleration engine, control logic determines whether a successive data input and an intermediate result will require processing by the same pipeline stage in the next clock cycle. If this is true, then the control logic for the core that incorporates the acceleration engine will wait to load the new data input until a subsequent clock cycle in which no intermediate result processing occurs at the shared pipeline stage. Such wait time will delay the progress of the pipeline until a subsequent clock cycle. As a result of the delay, processing of the previous conflicting intermediate result(s) will have had sufficient time to complete and prevent the simultaneous access to the same pipeline stage. Blocking introduces a delay penalty in data input processing by the acceleration engine by delaying all data inputs that sequentially follow a blocked input.

In exemplary embodiments, following the evaluation of the given acceleration engine's input-to-output latency and input blocking pattern characteristics for each valid configuration option combination as detailed above, the results of the evaluation are translated into a set of design parameters for the scheduler control structure. That is, based on the evaluation of the provided characteristics for a given hardware accelerator, general purpose hardware facilities are defined for the scheduler control structure that are reusable across the entire application space and can be leveraged to optimize accelerator performance for the requirements of a particular application within a reusable control structure in the ASIC core.

For illustration purposes, an exemplary embodiment of the present invention will now be described for a particular case in which a reusable scheduler control structure is implemented for a target hardware acceleration device that comprises an exemplary, configurable Advanced Encryption Standard (AES) cryptographic engine. Of course, it should be noted that the implementation of the present exemplary embodiment should be regarded as being non-limiting and that it is not the intent of this illustration to limit the present invention to implementations for reusable scheduler control structures to any specific type of hardware accelerator, and that those skilled in the art could apply the principles of the present exemplary embodiment when using any type of acceleration engine.

AES is a symmetric-key, cryptographic algorithm standard that is used in different security protocols such as, for example, for encrypting data between two parties across an unsecured connection. The fundamental unit of computation for an AES engine is referred to as a "round." The AES algorithm is performed in $N_r$ number of rounds. The architecture of one round contains two different datapaths, the encryption datapath and the key scheduling datapath. In the AES algorithm, the data block is 128 bits long and the key size can be 128, 192, or 256 bits. The size of the key defines the number of rounds that the algorithm is repeated. For instance, the value of $N_r$ is equal to 10, 12, or 14 for the key length of 128, 192, or 256 bits, respectively. Four different steps of the AES algorithm, provided in accordance with the recommendations of the U.S. National Institute of Standards and Technology, are performed in each round of the encryption datapath: (1) byte substitution, which is a non-linear operation that substitutes each byte of the round data independently according to a substitution table; (2) shift row, which is a circular shifting of bytes in each row of the round data (the number of shifted bytes is different for each row); (3) mix column, in which the bytes of each column are mixed together by multiplying the round data with a fixed polynomial modulo $x^4+1$; and (4) add key, in which the round data is XORed with the round key. All the above four steps are required for every round except that the last round does not include the mix column phase. Similar steps are followed in the key scheduling flow.

FIG. 1 is a block diagram illustrating the architecture of an exemplary AES cryptographic engine core 100. The architecture includes an encryption datapath 110 and a key scheduling datapath 120. Encryption datapath 110 can be used for the 10 round implementation of the AES algorithm, in which the key size is 128 bits. Each round is performed in a single clock cycle. Except the first round (round zero) that only performs the key addition phase, all other 10 rounds perform the four different steps of the AES algorithm: byte substitution 130, shift row 140, mix column 150 (which is not performed in the last round), and key addition 160, along with on-the-fly key scheduling provided by key scheduling datapath 120. Byte substitution 130 is implemented using look-up tables. A full encryption of a 128-bit block of data using a 128-bit key takes precisely 10 computation cycles.

An AES cryptographic engine is designed to accelerate the computation-intensive data encryption algorithm operations. These operations are encapsulated within a chip primarily to reduce the load on the host microprocessor and to maintain the secret information inside the chip. In exemplary embodiments, the particular AES cryptographic engine used in the present exemplary embodiment can be incorporated within an ASIC core that is programmed through a memory-mapped interface of an embedded CPU core as a subsection of a fabricated coprocessor integrated circuit and incorporated within a large class of SoCs and ASIC cores. In these cases, the CPU core posts data or interrogates data as if the ASIC core were a RAM memory unit using chip select and write enable control lines.

Figure 2:
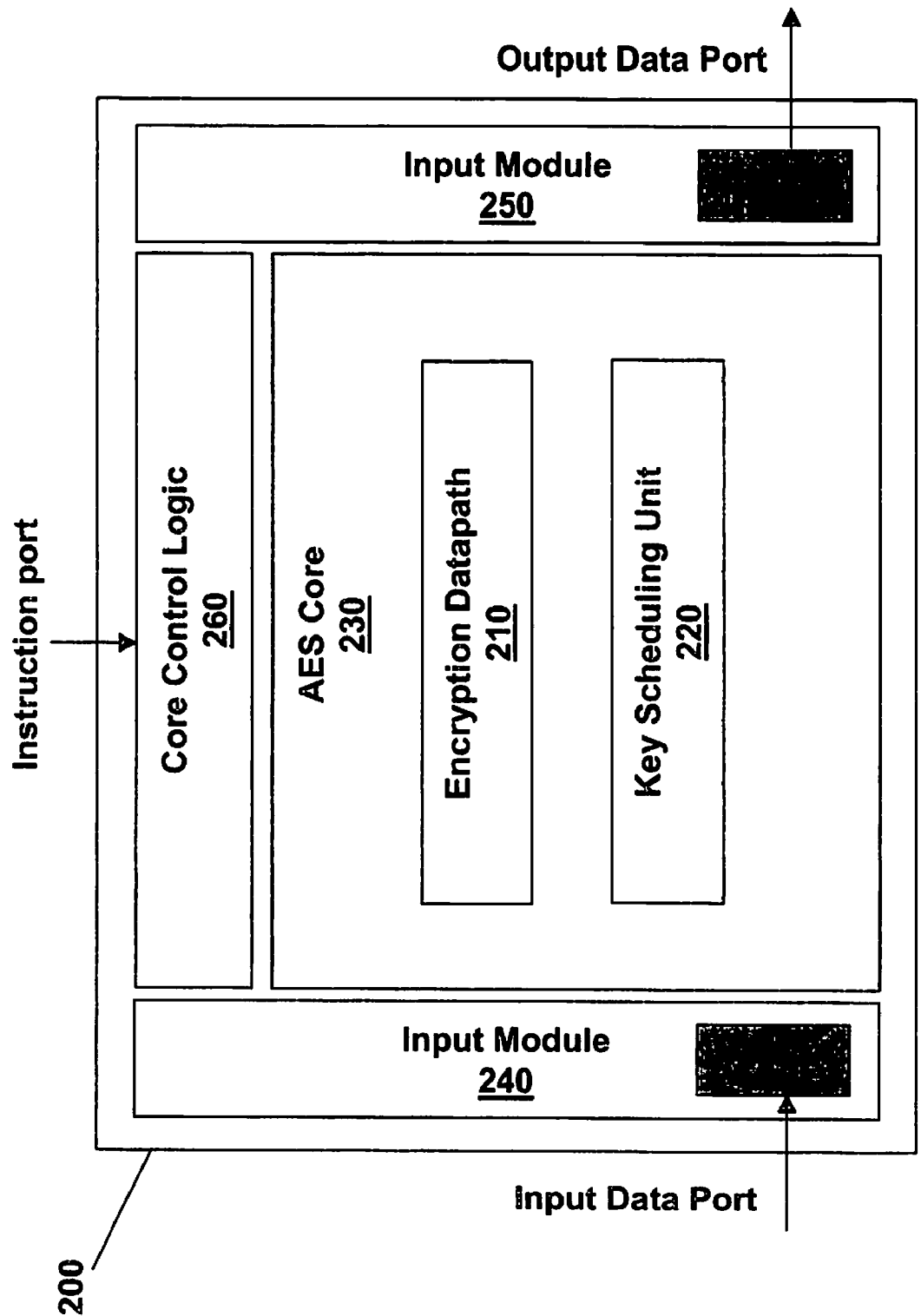
FIG. 2 is a block diagram illustrating the components of an exemplary AES cryptographic engine.

FIG. 2 illustrates a block diagram showing the different units of the exemplary AES cryptographic engine 200. An AES core 230 consists of the encryption datapath 210 and the key scheduling datapath 220. There is logic around AES core 230 for implementing different modes of operations, and input and output interfaces 240, 250 handle the reading of data inputs and writing of corresponding encrypted data outputs. AES engine 200 also includes a core controller 260 having control logic for reading in the instructions and controlling other units. When the operation of AES engine 200 is done for a data input, it will send a signal to core controller 260. Three registers connect the embedded CPU (not shown) to the I/O ports of core controller 260, which are the Instruction port, Input data port, and Output data port. The embedded CPU core can read or write to these registers by accessing different memory locations. The memory-mapped interface decodes the memory addresses and updates the registers' values.

In the present exemplary embodiment, to implement a reusable scheduler control structure that can be used to leverage the configuration options of the exemplary, configurable AES cryptographic engine, the latency and blocking pattern characteristics of the AES engine are first evaluated. The exemplary AES engine performs a sequence of 10 computation rounds to generate a 128-bit data output from a single 128-bit data input. Because the round computations are performed repetitiously, it thereby becomes possible to leverage the hardware implementing the round computation for processing either new input data or intermediate data results, in which data is "recycled" through the hardware. The penalty associated with using a given hardware round for processing both new and recycled data is a performance reduction since clock cycles used for processing recycled data are not available for processing new data. As a result, the core designer should be able to make a design tradeoff decision between considerations of physical size (that is, cell count) and performance by varying the number of physical usages of round computation hardware in a given AES engine implementation. As will be described, exemplary embodiments of reusable control structures in accordance with the present invention can provide for flexibility that makes it possible for the core designer to vary the number of round computation hardware usages by defining compile-time configuration options in accordance with the desired design trade-off for each given application.

In the present exemplary embodiment, the compile-time configuration options for the exemplary AES engine are defined as the pipeline depth, which is total number of hardware rounds implemented, and the number of rounds performed per clock cycle. The pipeline depth, which can be set to 1, 2, 5, or 10 hardware rounds in the exemplary AES engine, indicates the overall pipelining across all round computation hardware usages, while the number of rounds per clock cycle, which can be set to ½, 1, or 2 rounds per cycle in the exemplary AES engine, indicates pipelining either within a single round computation hardware usage (for the ½ or 1 round per clock cycle setting) or between a pair of neighboring round computation hardware usages (for the 2 rounds per clock cycle setting). Each particular combination of these configuration options will determine the number of acceleration engine pipeline stages that are implemented for a given design, which in turn will ultimately determine the cell count, latency, and performance characteristics of the particular core design. Furthermore, these configuration options determine the acceleration engine input blocking characteristics for future data inputs caused by the need to process recycled data associated with a given data input. The effect of each particular combination of the configuration options on input-to-output latency and the input blocking pattern characteristics for the exemplary AES engine is shown in the AES engine configuration matrix provided in Table 1 below.

In the timing diagram of Table 2, Data Input 1 is provided to the exemplary AES engine in clock cycle 0. Thereafter, blocking of future data input to the AES engine as a result of recycled data processing associated with Data Input 1 occurs during clock cycles 2, 4, 6, and 8. Data Output 1 corresponding to Data Input 1 is available upon completion of all 10 rounds of processing during clock cycle 10.

In the present exemplary embodiment, based on the resulting values for the latency and input blocking pattern variables for the specified combinations of the AES engine configuration output signals "AES_PD_Config(0:1)" and "AES_RPC_

TABLE 1

|  | 1 round (AES_PD_Config = '00'b) | 2 rounds (AES_PD_Config = '01'b) | 5 rounds (AES_PD_Config = '10'b) | 10 rounds (AES_PD_Config = '11'b) |
| --- | --- | --- | --- | --- |
| ½ round/cycle (AES_RPC_Config = '00'b) | L = 20 cycles<br>BP = cycles 2, 4, 6, 8, 10, 12, 14, 16, 18 | L = 20 cycles<br>BP = cycles 4, 8, 12, 16 | L = 20 cycles<br>BP = cycle 10 | L = 20 cycles<br>BP = none |
| 1 round/cycle (AES_RPC_Config = '01'b) | L = 10 cycles<br>BP = cycles 1, 2, 3, 4, 5, 6, 7, 8, 9 | L = 10 cycles<br>BP = cycles 2, 4, 6, 8 | L = 10 cycles<br>BP = cycle 5 | L = 10 cycles<br>BP = none |
| 2 rounds/cycle (AES_RPC_Config = '10'b) | L = invalid<br>BP = invalid | L = 5 cycles<br>BP = cycles 1, 2, 3, 4, 5 | L = 5 cycles<br>BP = cycles 2, 3 | L = 5 cycles<br>BP = none |

In Table 1, "AES_PD_Config" is a two-bit signal representing the pipeline depth configuration output from the AES engine and "AES_RPC_Config" is a two-bit signal representing the configuration output of the number of AES computation rounds performed per clock cycle. These configuration output signals are used to determine the selected latency and input blocking pattern characteristics of the AES engine for a given configuration. In Table 1, for a given combination of configuration outputs, "L" refers to the resulting latency from data input to output, and "BP" refers to the resulting blocking pattern for delaying acceptance of future data inputs due to the need for processing recycled data associated with a data input provided in clock cycle zero. In each clock cycle referred to by "BP" in a given configuration option combination, acceptance of new input data is delayed as a result of processing an input accepted at clock cycle 0. Variables "L" and "BP" are expressed in number of clock cycles. Where appropriate, "invalid" is used to indicate configuration options which are not valid, and "none" is used to indicate that no input data blocking occurs when no need to process recycled data will arise for a given configuration option combination.

To illustrate the relationship between input-to-output latency and the input blocking pattern, Table 2 provides a timing diagram for an example operation of the AES engine when the pipeline depth configuration option has been set to two hardware rounds and the pipeline depth configuration option has been set to one round per clock cycle.

Config(0:1)" in Table 1, general purpose hardware facilities can be defined that provide for a scheduler control structure that is reusable across the entire application space and can be leveraged to optimize operation of the exemplary AES engine in terms of a desired design tradeoff for a particular application. In the present exemplary embodiments, these general purpose hardware facilities for the scheduler control structure consist of the following hardware components: (1) Cycle Block Register; (2) Blocking Pattern Prediction Register; (3) Current Tag Counter; (4) Result Prediction Array; and (5) Result Look-Ahead Register.

Figure 3:
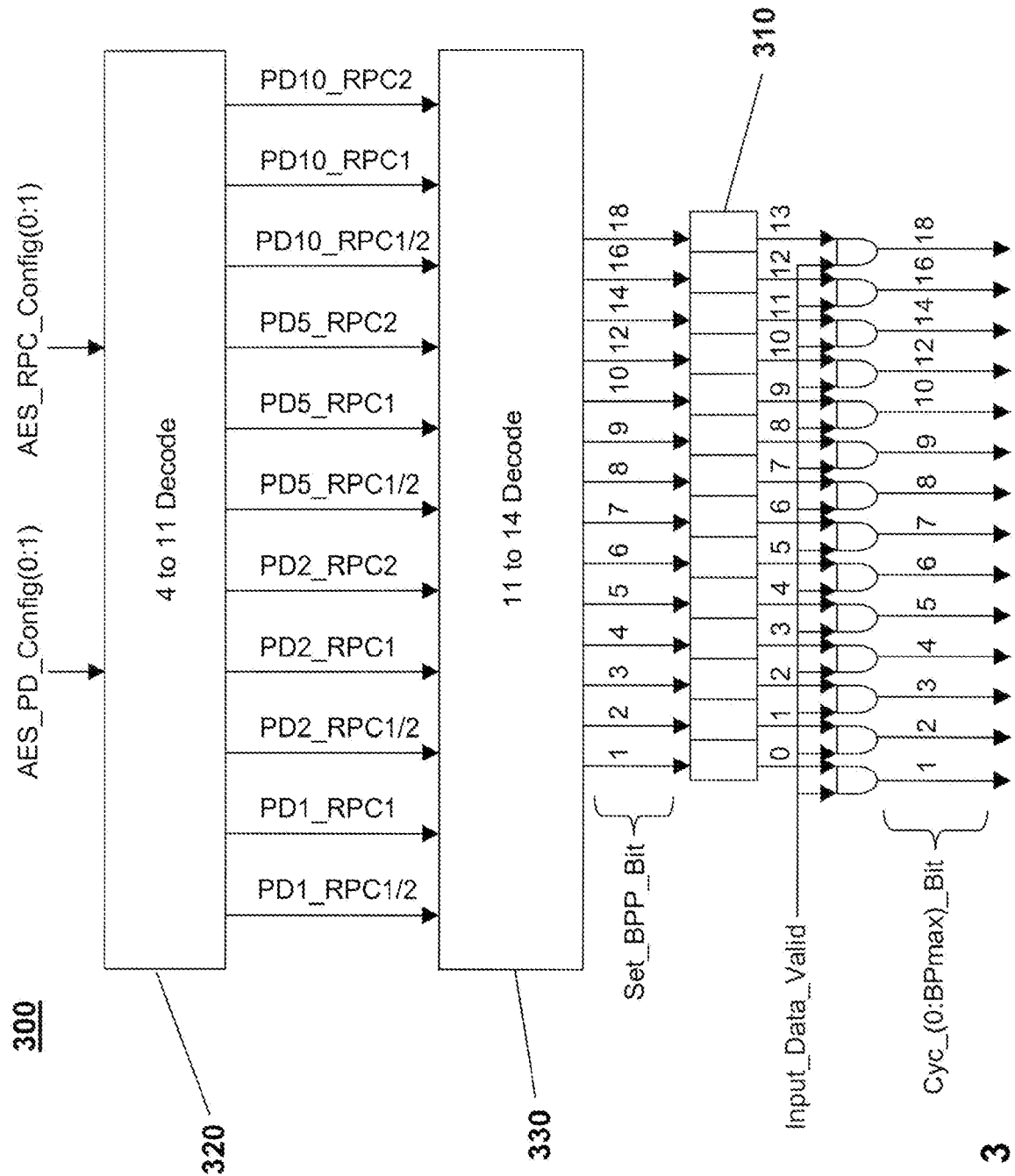
FIG. 3 is a block diagram illustrating an exemplary Cycle Block Register hardware structure of an exemplary embodiment of a scheduler control structure in accordance with the present invention.

FIG. 3 provides a block diagram of an exemplary Cycle Block (CB) Register hardware structure 300 in accordance with the present exemplary embodiment. The purpose of the CB Register 300 is to translate the AES engine configuration output signals "AES_PD_Config" and "AES_RPC_Config" into the appropriate blocking pattern so that acceptance of future data inputs is properly delayed when the need to process recycled data conflicts with processing the future data inputs.

CB Register 300 includes a storage register 310 for storing the output blocking pattern that corresponds to the AES engine configuration output signals. In the present exemplary embodiment, storage register 310 has a length of 14 bits to cover the entire blocking pattern space for all possible valid AES engine configuration combinations. In exemplary

TABLE 2

|  | Clock cycle | | | | | | | | | | |
| --- | --- | --- | --- | --- | --- | --- | --- | --- | --- | --- | --- |
|  | 0 | 1 | 2 | 3 | 4 | 5 | 6 | 7 | 8 | 9 | 10 |
| Data Input 1 Valid | YES | | | | | | | | | | |
| New Input Blocking | | | YES | | YES | | YES | | YES | | |
| Data Output 1 Valid | | | | | | | | | | | YES | embodiments, the length of the storage register is ultimately defined by the set of unique "BP" clock cycle values appearing in the corresponding acceleration engine configuration matrix (for example, Table 1 for the present exemplary AES engine). A zero-bit in a given bit position in storage register 310 indicates that the corresponding future AES engine clock cycle will not be blocked for new data input due to recycled data processing associated with the current data input, whereas a one-bit in a given bit position indicates that the corresponding future AES engine clock cycle will be blocked. The values of storage register 310 are held static once a given AES engine hardware configuration is established.

During operation of exemplary CB Register 300, AES configuration output signals "AES_PD_Config" and "AES_RPC_Config" are processed through a translation provided by a two-level decoder logic circuit 320, 330 to identify the selected configuration output combination of the acceleration engine matrix. First level 320 of the decoder translation identifies one of the possible valid combinations of the pipeline depth and rounds per clock cycle configuration outputs. In the present exemplary embodiment, first level 320 is provided as a 4-to-11 line decoder, translating the 4 bits provided in the AES configuration outputs to the 11 possible valid combinations for the values of the latency and blocking pattern variables in Table 1. Second level 330 of the decoder translation identifies the specific cycle blocking pattern associated with the values provided by the first level translation. In the present exemplary embodiment, second level is provided as a 11-to-14 line decoder, translating the 11 bits provided for the possible valid combinations of the values of the latency and blocking pattern variables to 14 bits corresponding the clock cycles identified in Table 1 as those in which future data inputs can be blocked due to recycled data processing associated with the current data input for each possible valid configuration output combination. The second level translation result is captured in storage register 310. Whenever the control logic for the core sends input data to the AES Engine (by asserting the "Input_Data_Valid" signal as indicated in FIG. 3), the cycle blocking pattern that is captured in CB Register 300 during that clock cycle is output as the signals "Cyc_(0:$BP_{max}$)_Bit", where $BP_{max}$ corresponds to the maximum potential input blocking clock cycle for a given blocking pattern for all AES engine configuration options appearing in the corresponding acceleration engine configuration matrix.

Figure 4:
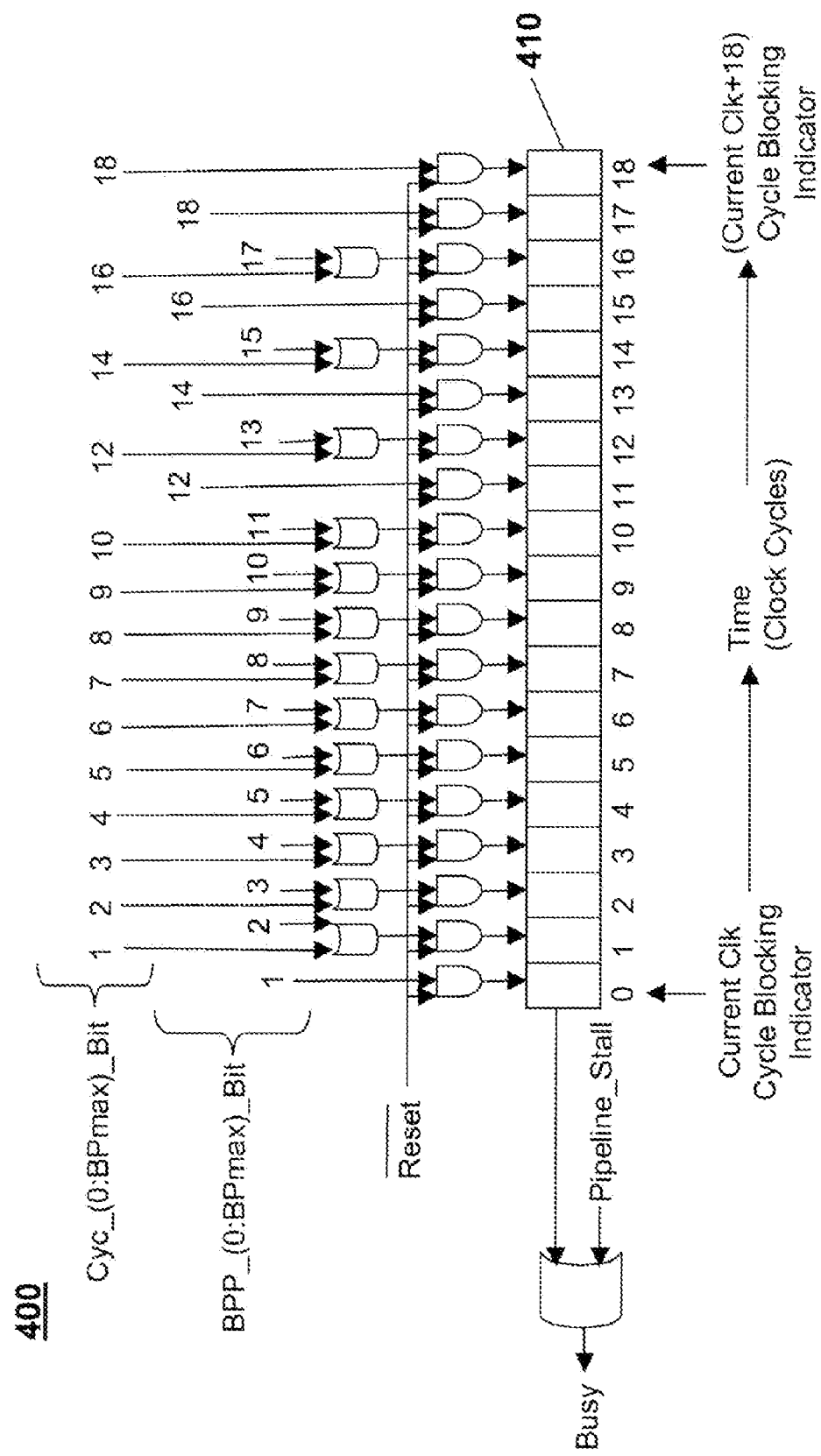
FIG. 4 is a block diagram illustrating an exemplary Blocking Pattern Prediction Register hardware structure of an exemplary embodiment of a scheduler control structure in accordance with the present invention.

FIG. 4 provides a block diagram of an exemplary Blocking Pattern Prediction (BPP) Register hardware structure 400 in accordance with the present exemplary embodiment. The purpose of BPP Register 400 is to predict the availability of the exemplary AES engine for accepting data input during future clock cycles.

BPP Register 400 includes a storage register 410 to store all possible configuration options for the AES engine. In exemplary embodiments, the length of storage register 410 has a value of (1+$BP_{max}$). In the present exemplary embodiment, for instance, storage register 410 has a length of 19 bits because $BP_{max}$ is specified by the 18 clock cycles in which blocking could occur during operation of the AES engine over the maximum latency of 20 clock cycles in the AES engine configuration matrix when the pipeline depth configuration option has been set to one hardware round and the rounds per cycle configuration option has been set to ½ round per clock cycle. Bit position 0 in storage register 410, which represents the availability of the AES engine for accepting a new data input on the current clock cycle, is sent back to the control logic for the core. Bit positions 1-18 in storage register 410 represent availability of the AES engine for accepting future data inputs on the next 18 subsequent clock cycles. A zero-bit in a given bit position in storage register 410 indicates that the AES engine is available for accepting a new data input during the corresponding future clock cycle, whereas a one-bit in a given bit position indicates that the AES engine in not available for (that is, blocked from) accepting a new data input during the corresponding future clock cycle. All bit positions of storage register 410 are reset to zero-bits whenever the AES engine is reset (that is, when the control logic for the core activates the "Reset" signal).

Storage register 410 of exemplary BPP register is organized as a shift register logic circuit. In any clock cycle during normal operation of BPP register 400 in which neither data input is available for the AES engine nor the "Busy" signal is active in the case of an occurrence of a pipeline stall for resolving a hazard, the current values in the bit positions of storage register 410 are automatically shifted one position to the left and bit position 18 is padded with a zero-bit. In any clock cycle during normal operation of BPP register 400 in which AES engine input data is indicated as being available (that is, when the control logic for the core is asserting the "Input_Data_Valid" signal) and the "Busy" signal is not active, the appropriate clock cycle blocking pattern is determined based on the cycle blocking pattern represented by those "Cyc_(0:$BP_{max}$)_Bit" signals output from the CB Register having a logic one value and loaded into storage register 410. Furthermore, in the latter case, those bits not loaded with cycle blocking pattern data (that is, either "Cyc_(0:$BP_{max}$)_Bit" signals having a logic zero value or those not influenced by "Cyc_(0:$BP_{max}$)_Bit" signals) are loaded with left shift operation data.

Though not applicable to the AES engine of the present exemplary embodiment, BPP register 400 can be configured with an exception condition for handling pipeline stalls in other exemplary embodiments implemented for acceleration engines that are configured to signal a "Pipeline_Stall" condition when the "Reset" signal is not active. In the case of such a pipeline stall condition, the following actions are taken by BPP register 400. First, the "Busy" signal is asserted back to the control logic for the core to block any new data input from being sent to the acceleration engine. Then, any left shift operations that would occur upon the bit positions of storage register 410 during a clock cycle are blocked until the "Pipeline_Stall" signal is de-asserted.

Figure 5:
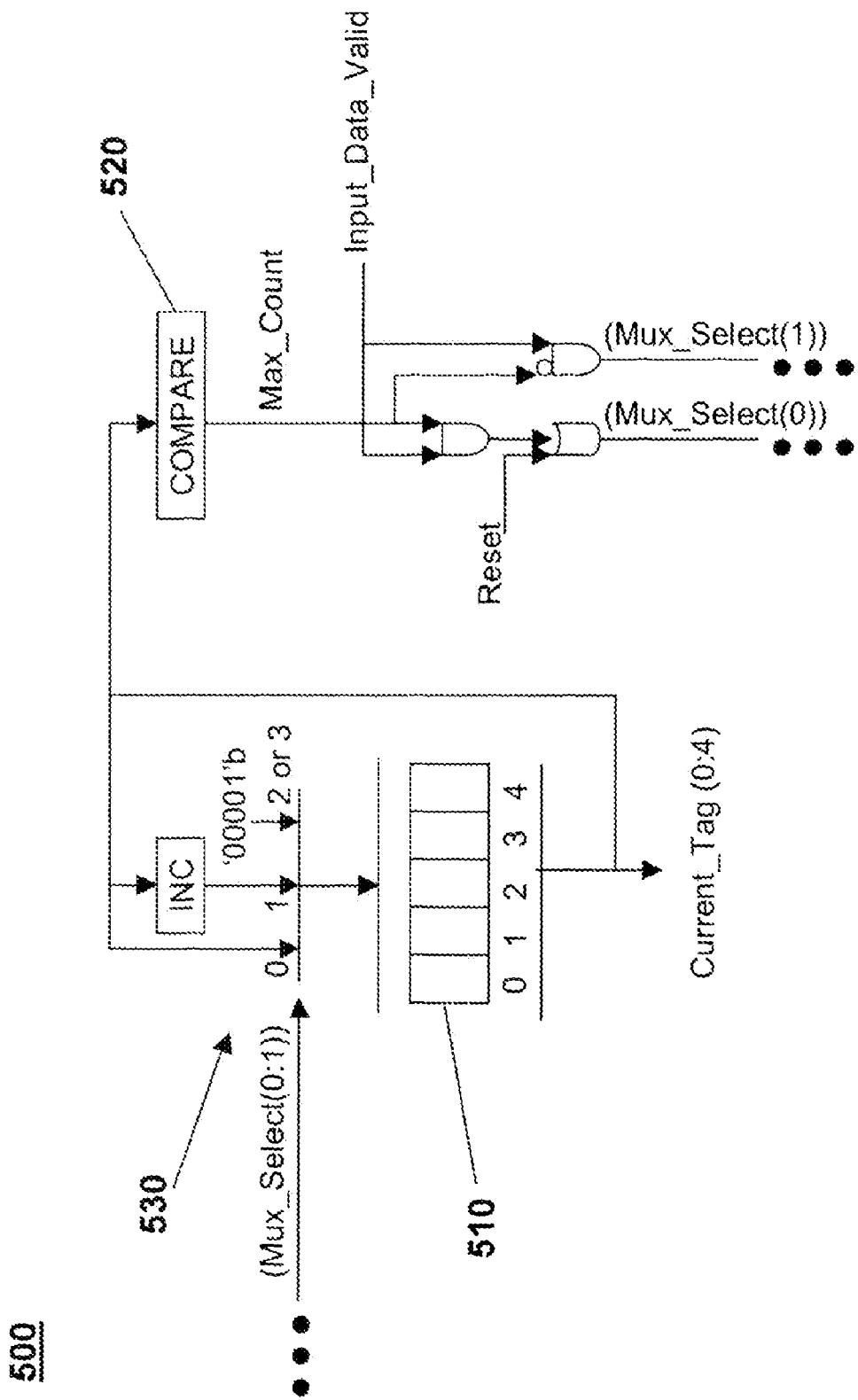
FIG. 5 is a block diagram illustrating an exemplary Current Tag Counter hardware structure of an exemplary embodiment of a scheduler control structure in accordance with the present invention.

FIG. 5 provides a block diagram of an exemplary Current Tag (CT) Counter hardware structure 500 in accordance with the present exemplary embodiment. The purpose of CT Counter 500 is to provide a unique identifier tag for the current and/or all future results output from the acceleration engine. The CT Counter includes a synchronous counter circuit 510 for assigning identifier tags, output as the value of "Current_Tag(0:w)", to AES engine output signals during each clock cycle. In exemplary embodiments, counter circuit 510 has a width w that is equal to the width of the Result Prediction Array described below, and the value of "Current_Tag(0:w)" in counter circuit 510 is reset to one (for example, "Current_Tag(0:4)" in a counter circuit having a width of five is reset to '00001') whenever the acceleration engine is reset.

During operation of exemplary CT Counter 500, a "Mux_Select(0:1)" logic circuit 530 selects which of three values is loaded into counter circuit during each clock cycle according to compare logic 520. The incremented value of "Current_Tag(0:w)" is loaded into counter circuit 510 when a data input is provided to the AES engine and "Current_Tag(0:w)" is below its maximum value. A bit value corresponding to the number one is loaded into counter circuit 510 when input data is provided to the AES engine and "Current_Tag(0:w)" is at its maximum value (that is, when a register flip or "wrap" situation arises) or when the AES engine is reset. In any other situation, the current value of "Current_Tag(0:w)" is loaded into counter circuit 510.

Figure 6:
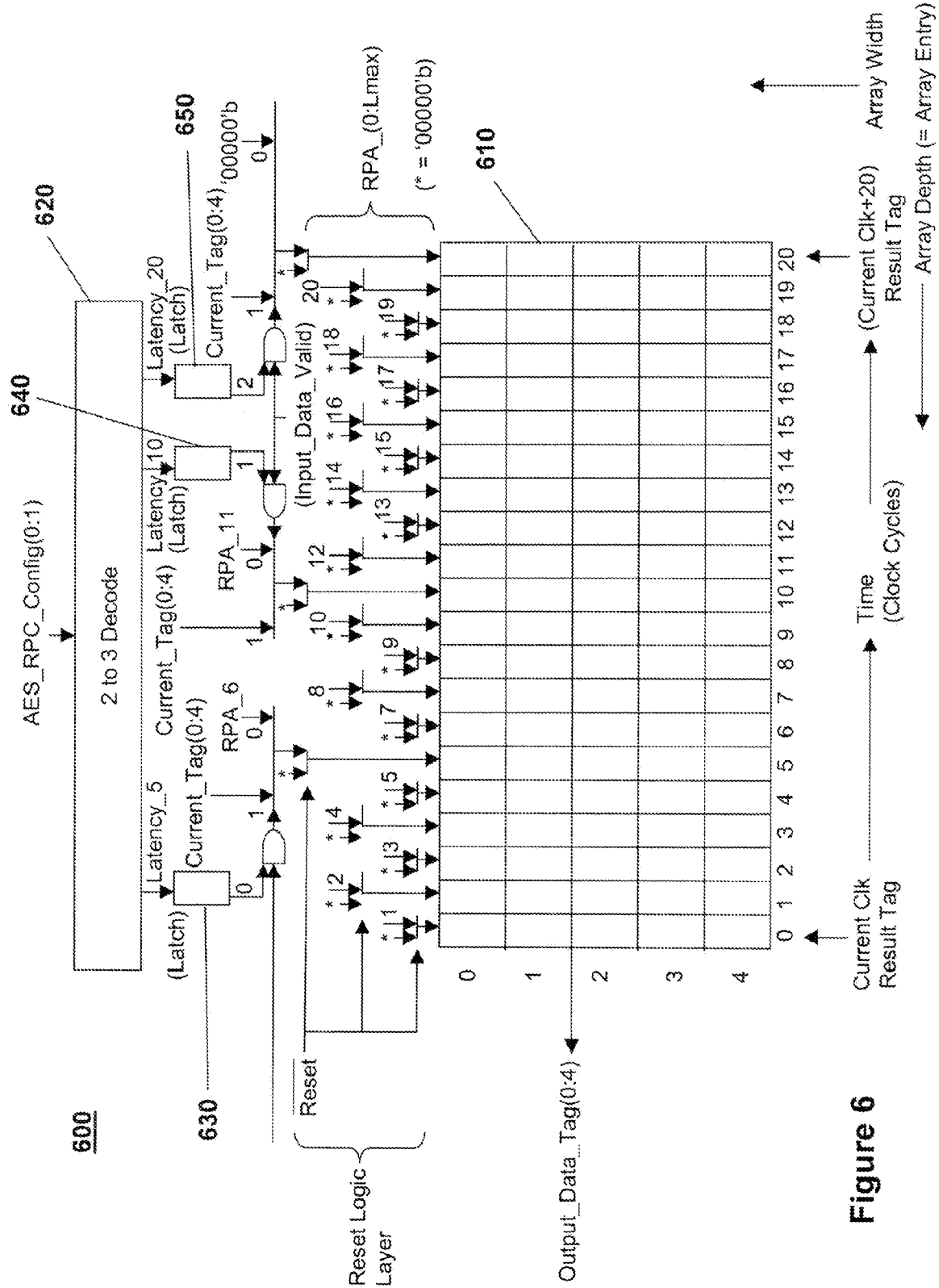
FIG. 6 is a block diagram illustrating an exemplary Result Prediction Array hardware structure of an exemplary embodiment of a scheduler control structure in accordance with the present invention.

FIG. 6 provides a block diagram of an exemplary Result Prediction (RP) Array hardware structure 600 in accordance with the present exemplary embodiment. The purpose of RP Array 600 is to translate the AES engine configuration output signal "AES_RPC_Config" into the appropriate input blocking pattern so that acceptance of future data inputs is properly delayed when the need to process recycled data conflicts with processing of the future data inputs, as well as to predict the schedule of results output by the acceleration engine during future clock cycles.

RP Array 600 includes a bit array structure 610 configured to cover all possible AES engine configuration options. In exemplary embodiments, the depth of array 610 has a value of $(1+L_{max})$, where $L_{max}$ corresponds to the maximum number of input-to-output latency clock cycles for all acceleration engine configuration option combinations appearing in the corresponding acceleration engine configuration matrix. In exemplary embodiments, the width of array 610 has a value of $\log_2(1+[L-\#BP]_{max})$, where #BP corresponds to the number of input blocking clock cycles in a given configuration option combination and $[L-\#BP]_{max}$ corresponds to maximum difference between the values of the latency and blocking pattern variables in all possible valid configuration option combinations in the corresponding acceleration engine configuration matrix. For configuration combinations in which the value of BP is equal to "none", zero is used for the value of #BP. In situations in which the value of $\log_2(1+[L-\#BP]_{max})$ is not a whole number, the array width is rounded up to the nearest whole number. In the present exemplary embodiment, for instance, array 610 has a width of 5 bits because $[L-\#BP]_{max}$ has a value of 20, as specified by the difference between the 20 latency clock cycles and 0 input blocking pattern clock cycles in the AES engine configuration matrix when the pipeline depth configuration option has been set to 10 hardware rounds and the rounds per clock cycle configuration option has been set to ½ round per clock cycle. That is, in this example, $\log_2(1+20)=4.392$, which results in the width of array 610 being 5 after rounding. The value of the bits corresponding to depth position 0 of array 610, which contains the tag of the acceleration engine output result available in the current clock cycle, is sent back to the control logic for the core. The values of the bits corresponding to depth positions 1 through $L_{max}$ of array 610 contain the tag of the result available in the next $L_{max}$ subsequent clock cycles. All entries in array 610 are reset to a value of zero whenever the acceleration engine is reset.

During normal operation of exemplary RP Array 600, AES configuration output "AES_RPC_Config" is processed through a translation provided by a decoder logic circuit 620 to identify which of the possible rounds per clock cycle values has been set as the configuration output, and the outputs of the decoder are latched in latches 630-650. The outputs captured in these latches determine which of three RP Array entries is used to load the "Current_Tag(0:w)" output from CT Counter 500 whenever a valid data input is sent to the AES engine. In the present exemplary embodiment, decoder 620 is provided as a 2-to-3 line decoder, translating the 2 bits provided in the rounds per clock cycle configuration output to the 3 possible numbers of rounds of clock cycles in Table 1. The choice of load locations corresponds to the number of latency clock cycles in the acceleration engine until the corresponding data output result is available, as reflected in the acceleration engine configuration matrix.

Similar to BPP Register 400, RP Array 600 is organized as a shift register. In any clock cycle during normal operation of RP Array in which neither data input is available for the AES engine nor the "Busy" signal is active in the case of an occurrence of a pipeline stall for resolving a hazard, the current values in the bit positions of array 610 are automatically shifted one position to the left (along the depth dimension) and the bits corresponding to depth position $L_{max}$ are padded with a value corresponding to the number zero (for example, the bits corresponding to depth position $L_{max}$ in an array having a width of five are reset to '00000'). In any clock cycle during normal operation of RP Array in which AES engine input data is indicated as being available (that is, when the control logic for the core is asserting the "Input_Data_Valid" signal) and the "Busy" signal is not active, the value of "Current_Tag(0:w)" is loaded into the appropriate RP Array entry as determined by the values in latches 630-650, which identify one of the possible rounds per clock cycle configuration outputs (for example, either ½, 1, or 2 rounds per clock cycles) that corresponds to 5, 10, or 20 latency clock cycles in the acceleration engine configuration matrix provided in Table 1. Furthermore, in the latter case, all remaining RP Array entries are loaded with left shift operation data.

Though not applicable to the AES engine of the present exemplary embodiment, RP Array 600 can be configured with an exception condition for handling pipeline stalls in other exemplary embodiments implemented for acceleration engines that are configured to signal a "Pipeline_Stall" condition when the "Reset" signal is not active. In the case of such a pipeline stall condition, the following actions are taken by RP Array 600. First, the "Busy" signal is asserted back to the control logic for the core to block any new data input from being sent to the acceleration engine. Then, any left shift operations that would occur in array 610 during a clock cycle are blocked until "Pipeline_Stall" is de-asserted.

Figure 7:
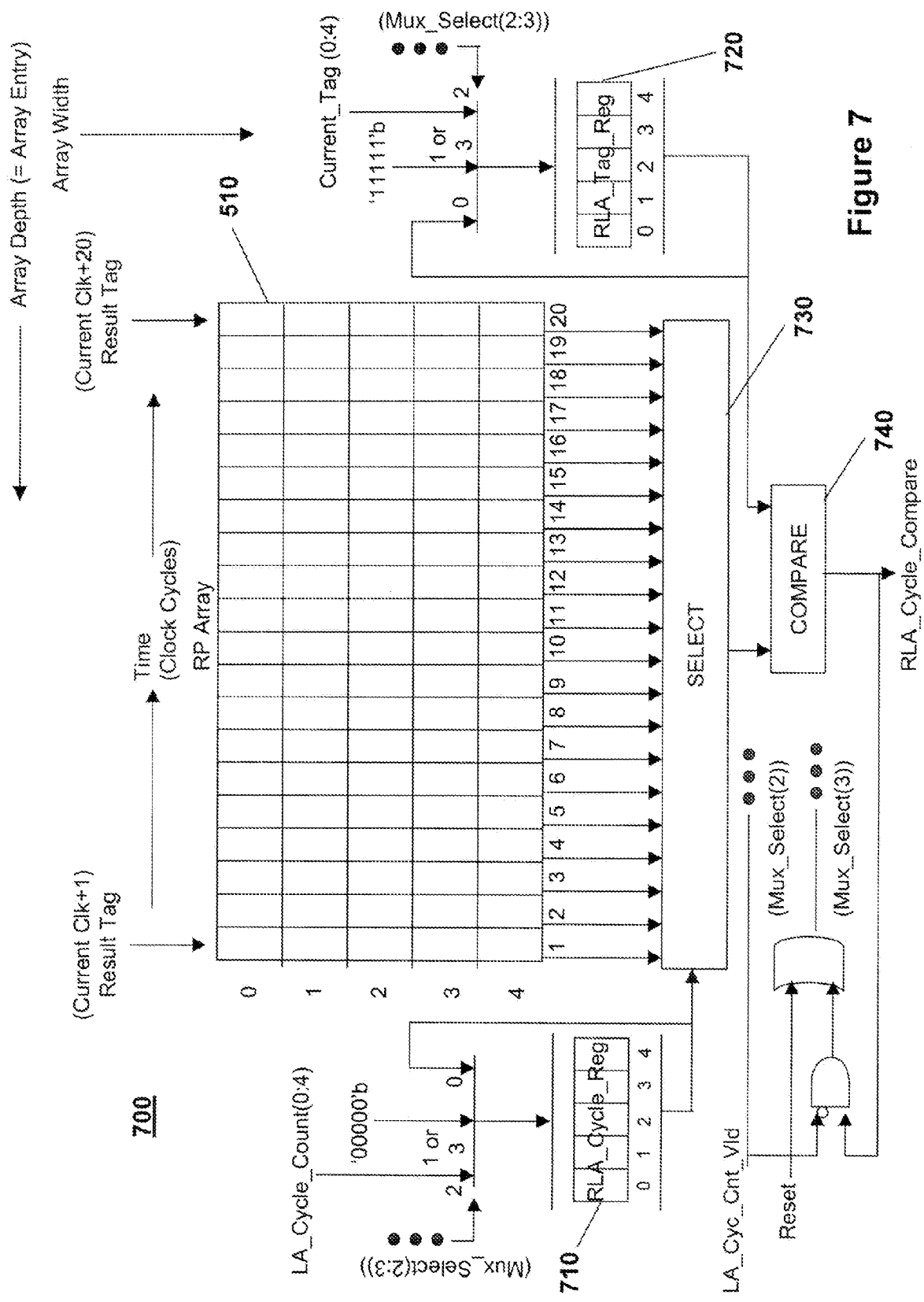
FIG. 7 is a block diagram illustrating an exemplary Result Look-Ahead Register hardware structure of an exemplary embodiment of a scheduler control structure in accordance with the present invention.

FIG. 7 provides a block diagram of an exemplary Result Look-Ahead (RLA) Register hardware structure 700 in accordance with the present exemplary embodiment. The purpose of the RLA Register is to provide look-ahead capability for predicting when a given acceleration engine output result will be available. The control logic of the core can take advantage of this capability to initiate other operations involving predecessor output results in advance of the predicted result being available, thereby optimizing performance. It should be noted that in exemplary embodiments implemented for such systems, it is important that no acceleration engine pipeline stalls further delay processing of such a final output result after the prediction occurs because of the potential for system errors to result. It should also be noted that for the AES engine of the present exemplary embodiment, no such pipeline stalls would occur.

RLA Register includes a cycle register 710 ("RLA_Cycle_Reg") having a width of $\log_2(L_{max})$ to cover all possible pipeline depth configuration options for a given accelerator engine. In cases in which the value of $\log_2(L_{max})$ is not a whole number, it is rounded up to the nearest whole number. In the present exemplary embodiment, for instance, cycle register 710 has a width of 5 bits because $L_{max}$ has a value of 20, as specified by the 20 latency clock cycles obtained in the AES engine configuration matrix when the rounds per clock cycle configuration option has been set to ½ round per clock cycle. That is, in this example, $\log_2(20)=4.323$, which results in the width of cycle register 710 being 5 after rounding. RLA Register also includes a tag register 720 ("RLA_Tag_Reg") having a width that is equal to the width of counter circuit 510 of exemplary CT counter 500. Whenever the acceleration engine is reset, the value of "RLA_Tag_Reg" is reset to zero (for example, "RLA_Tag_Reg(0:4)" in a tag register having a width of five is reset to '00000') and the value of "RLA_Cycle_Reg" is reset to one (for example, "RLA_Cycle_Reg(0:4)" in a cycle register having a width of five is reset to '00001').

During operation of exemplary RLA Register 700, the control logic of the core, concurrent with sending data input to be tagged for result look-ahead prediction, will assert the desired number of clock cycles for look-ahead in advance of predicting the result being available into cycle register 710 by sending the appropriate signals through "LA_Cycle_Count" and activating the "LA_Cyc_Cnt_Vld" signal. The "LA_Cycle_Count" are captured into cycle register 710 and the corresponding input data tag output from CT Counter 500 as the "Current_Tag" signal is captured into tag register 720. The value stored in cycle register 710 is decoded using select logic circuit 730, and the values of the bits corresponding to 1 of the depth positions 1-$L_{max}$ of array 610 of RP Array 600 that contain the tag of the result available in the later clock cycle associated with the future input data for which look-ahead is enabled is selected for input to compare logic circuit 740. When the selected tag progresses to the desired look-ahead clock cycle, the following actions are performed. First, because the selected tag will match the "RLA_Tag_Reg" value, compare logic circuit 740 is activated to send the "RLA_Cycle_Compare" signal back to control logic for the core. Then, the value in cycle register 710 is reset to a value corresponding to zero (for example, "RLA_Cycle_Reg(0:4)" in a cycle register having a width of five is reset to '00000'), causing an invalid zero tag value to be sent to compare logic so that no RP Array entry is selected. Finally, all bits stored in tag register 720 are set to one (for example, "RLA_Tag_Reg(0:4)" in a tag register having a width of five is set to '11111') so that "RLA_Tag_Reg" is provided with a value other than the invalid zero tag value. The latter two steps render compare logic circuit 740 inactive until subsequent set up by the control logic for the core is performed.

As an example how the control logic for the core can leverage RLA Register 700 to enhance performance, in an exemplary acceleration engine in which a given burst transfer is required to complete without allowing any gaps, the look-ahead capability provided by the RLA Register can allow for the burst transfer to start before the final output result associated with the burst becomes available. For instance, in a situation in which the control logic for the core is transferring 12 data output results to a device from an acceleration engine having an input-to-output data latency of 20 clock cycles, the control logic, concurrent with sending the 12th input of the burst to the acceleration engine, would input the value '01100' (that is, 12) on the "LA_Cycle_Count (0:4)" and assert the "LA_Cyc_Cnt_Vld" signal. When the control logic for the core subsequently sees the "RLA_Cycle_Compare" signal asserted, it will latch this signal and then initiate the burst operation to the device so that the final transfer of the burst is timed to occur concurrently with the availability of 12th data output result from the acceleration engine. By leveraging the look-ahead capability provided by RLA Register 700, the burst operation is able to start 12 cycles earlier than if the control logic for the core were forced to wait until availability of the 12th data output result from the acceleration engine to start the burst operation.

Exemplary embodiments of the present invention may be implemented within an ASIC core that integrates the target hardware acceleration engine and may be embedded within an SoC. In exemplary embodiments, ASIC core implementations including scheduler control structure hardware can be offered as generic gate netlists that comprise a Boolean-algebra representation (expressed using, for example, gates and cells) of the core's logical function, analogous to an assembly code listing for a high-level software application. In other exemplary embodiments, the functionality of ASIC core implementations may be provided as a synthesizable core description provided in an HDL, such as Verilog or VHDL, or alternatively as a fully routed design that could be printed directly onto a photo-lithographic mask (also known as a hard macro).

In exemplary embodiments in which a scheduler control structure is implemented as an ASIC core that is embedded within an SoC, the SoC may also integrate one or more microcontroller, microprocessor, or DSP cores; memory blocks including a selection of ROM, RAM, EEPROM, and Flash, timing sources including oscillators and phase-locked loops, peripherals including counter-timers, real-time timers and power-on reset generators, external interfaces including industry standards such as USB, FireWire, Ethernet, USART, SPI, analog interfaces including ADCs and DACs, voltage regulators, and power management circuits, as well as the software that controls the microcontroller, microprocessor, or DSP cores, peripherals, and interfaces. In exemplary embodiments, these blocks are connected by either a proprietary or industry-standard bus. In exemplary embodiments, DMA controllers can be implemented to route data directly between external interfaces and memory, by-passing the embedded CPU core, and thereby increasing the data throughput of the SoC. In exemplary embodiments, hardware blocks of the SoC can be constructed using CAD tools to express the required functionality, and the software modules can be integrated using a software development environment.

In developing exemplary embodiments directed to implementations within an ASIC core that incorporates the target hardware acceleration engine, a designer may initially construct the functionality of the ASIC core implementation by providing a synthesizable core description in a Hardware Descriptive Language (HDL), such as Verilog or VHDL. Performance testing and monitoring of the HDL core description can be performed under various loading conditions. For instance, such functional testing may be performed using techniques such as logic simulation, formal verification, emulation, or creating an equivalent pure software model. Additionally, or alternatively, testing may be performed in a hardware bring-up environment.

In exemplary embodiments, after simulation, logic synthesis may be used to transform the HDL design into a large collection of lower-level constructs called standard cells. These constructs can be taken from a standard-cell library consisting of pre-characterized collections of gates (for example, 2 input nor, 2 input nand, inverters, etc.). The standard cells are typically specific to the planned manufacturer of the ASIC. The resulting collection of standard cells, plus the needed electrical connections between them, can be provided as a gate-level netlist that comprise a Boolean-algebra representation of the core's logical function, analogous to an assembly code listing for a high-level software application. The gate-level netlist can then be processed by a placement tool that attempts to find a placement of the standard cells onto a region representing the final ASIC core implementation, subject to a variety of specified constraints. A routing tool may then use the physical placement of the standard cells and the netlist to create the electrical connections therebetween. The routing output is a file that corresponds to a fully routed design that can be printed directly onto one or more photo-lithographic masks (also known as a hard macros), which can then enable the production of physical integrated circuits using semiconductor fabrication, such as by using Complimentary Metal Oxide Silicon (CMOS) technology.

Accordingly, aspects of exemplary embodiments of the present invention may be realized in hardware, software, firmware, or a combination thereof. Exemplary embodiments may be realized in a centralized fashion in at least one computer system or in a distributed fashion where different elements are spread across several interconnected computer systems. Any kind of computer system or other apparatus adapted for carrying out the mechanisms described herein is suited. A typical combination of hardware, software, and firmware may be a general-purpose computer system with a computer program that, when being loaded and executed, controls the computer system such that it carries out the methods described herein.

Exemplary embodiments of the present invention may be implemented as a board level product, as a single chip, within an ASIC core, or with varying levels integrated on a single chip and other portions of the system as separate components. In exemplary embodiments, the degree of integration of the implementation can be primarily determined by speed and cost considerations. Because of the sophisticated nature of modern processors, it is possible to utilize a commercially available processor, which may be implemented external to ASIC implementations of exemplary embodiments of the present invention. In alternative exemplary embodiments, if the processor is available as an ASIC core or logic block, then the commercially available processor may be implemented as part of an ASIC device having various functions implemented as firmware.

Exemplary embodiments of the present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. Of course, other meanings of computer program within the understanding of those skilled in the art are also contemplated by exemplary embodiments of the present invention.

While the invention has been described with reference to certain exemplary embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular exemplary embodiments disclosed, but that the present invention will include all embodiments falling within the scope of the appended claims.

What is claimed is:

1. A reusable hardware control structure for a hardware acceleration engine that can be configured for implementation within an electronic integrated circuit design according to any one of a plurality of configuration alternatives, the reusable hardware control structure comprising:

a digital logic circuit design developed to receive configuration data from the hardware acceleration engine describing a selected configuration alternative, the selected configuration alternative being any one of the plurality of configuration alternatives, the digital logic circuit design being developed to process the configuration data to provide an evaluation of an input-to-output latency and an input blocking pattern of the hardware acceleration engine configured according to the selected configuration alternative, the evaluation being capable of being leveraged by control logic within the electronic integrated circuit design to increase utilization of the hardware acceleration engine.

2. The reusable hardware control structure of claim 1, wherein the digital logic circuit design comprises a cycle block register configured to provide a translation of the configuration data into the input blocking pattern for the selected configuration alternative, a blocking pattern prediction register configured to provide a prediction of the availability of the hardware acceleration engine for accepting data inputs provided to the hardware acceleration engine in subsequent clock cycles, a current tag counter configured to provide a unique identifier tag for each data output provided by the hardware acceleration engine that corresponds to a data input provided to the hardware acceleration engine, a result prediction array configured to translate the configuration data into the appropriate input blocking pattern to provide a prediction of the clock cycles in which data outputs corresponding to data inputs provided to the hardware acceleration engine in subsequent clock cycles will be output by the hardware acceleration engine, and a result look-ahead register configured to provide predictions of the clock cycles in which data outputs corresponding to data inputs provided to the hardware acceleration engine in subsequent clock cycles will be provided output by hardware acceleration engine.

3. The reusable hardware control structure of claim 2, wherein the cycle block register comprises a decoder circuit having a first decoder level and a second decoder level, the first decoder level being configured to process the configuration data to identify the selected configuration alternative from the plurality of configuration alternatives, the second decoder level being configured to provide a translation of the configuration data into the input blocking pattern associated with the selected configuration alternative identified by the first decoder level.

4. The reusable hardware control structure of claim 3, wherein the cycle block register further comprises a first storage register having a plurality of bit positions configured to store and output a representation of the input blocking pattern provided by the second decoder level.

5. The reusable hardware control structure of claim 4, wherein the blocking pattern prediction register comprises a shift register, the shift register having a plurality of bit positions configured to concurrently store the representation of the input blocking pattern output by the first storage register and store left shift operation values for bit positions not affected by the blocking pattern during each clock cycle in which a data input is available for the hardware acceleration engine, the shift register being configured to shift the current values in the bit positions of the shift register one position to the left and pad the right-most bit position with a zero-bit during each clock cycle in which no data input is available for the hardware acceleration engine.

6. The reusable hardware control structure of claim 5, wherein the blocking pattern prediction register is configured to provide for an exception condition for handling any pipeline stalls during operation of the hardware acceleration engine.

7. The reusable hardware control structure of claim 6, wherein the current tag counter comprises a synchronous counter circuit configured to provide a unique identifier tag to any data output provided by the hardware acceleration engine during each clock cycle.

8. The reusable hardware control structure of claim 7, wherein the result prediction array comprises a decoder circuit and a bit array circuit, the decoder circuit being configured to provide a translation of the configuration data into the input-to-output latency for the selected configuration alternative, the bit array circuit being configured to receive the unique identifier tag corresponding to any data output provided by the hardware acceleration engine in a current clock cycle and each subsequent clock cycle to a clock cycle corresponding to input-to-output latency for the selected configuration alternative from the synchronous counter circuit, the bit array circuit being configured to store and provide the unique identifier tags received from the synchronous counter circuit.

9. The reusable hardware control structure of claim 8, wherein the result prediction array is configured to provide for an exception condition for handling any pipeline stalls during operation of the hardware acceleration engine.

10. The reusable hardware control structure of claim 9, wherein the result look-ahead register is configured to receive a specified clock cycle, to receive the unique identifier tag corresponding to any data output provided by the hardware acceleration engine in a current clock cycle from the synchronous counter circuit and the unique identifier tag corresponding to any data output provided by the hardware acceleration engine in the specified subsequent clock cycle from the bit array circuit, and to provide a prediction of the clock cycle in which any data output provided by the hardware acceleration engine in the specified subsequent clock cycle will be provided from the hardware acceleration engine.

11. The reusable hardware control structure of claim 1, wherein the selected configuration alternative is specified by a designer according to a desired tradeoff of physical size, performance, latency, and overall throughput characteristics according to the requirements of a particular application for the hardware acceleration engine.

12. The reusable hardware control structure of claim 1, wherein the hardware acceleration engine comprises a component selected from cryptographic engines, vector and graphics processors, Discrete Cosine Transform (DCT) engines, and Inverse Discrete Cosine Transform (IDCT) engines.

13. The reusable hardware control structure of claim 1, wherein the hardware acceleration engine comprises an Advanced Encryption Standard (AES) cryptographic engine.

14. The reusable hardware control structure of claim 13, wherein the plurality of configuration alternatives comprise a plurality of combinations of values for pipeline depth and rounds performed per clock cycle for the AES cryptographic engine.

15. The reusable hardware control structure of claim 1, wherein the selected configuration alternative can be provided to a hardware compiler configured to generate an integrated circuit core corresponding to the electronic integrated circuit design.

16. The reusable hardware control structure of claim 15, wherein the electronic integrated circuit design is configured to be provided to the hardware compiler as a synthesizable core description provided in a Hardware Definition Language (HDL).

17. The reusable hardware control structure of claim 15, wherein the electronic integrated circuit design is configured to be provided to the hardware compiler as a generic gate netlist.

18. The reusable hardware control structure of claim 15, wherein the integrated circuit core is generated in the form of an ASIC core.

19. The reusable hardware control structure of claim 18, wherein the ASIC core is programmed through a memory-mapped interface of an embedded CPU core.

20. A method for increasing utilization of a hardware acceleration engine having a plurality of configuration alternatives that can be configured for implementation within an electronic integrated circuit design according to any one of a plurality of configuration alternatives, the method comprising:

receiving configuration data from the hardware acceleration engine describing a selected configuration alternative, the selected configuration alternative being any one of the plurality of configuration alternatives;

processing the configuration data to provide an evaluation of an input-to-output latency and an input blocking pattern of the hardware acceleration engine configured according to the selected configuration alternative; and leveraging the evaluation using control logic within the electronic integrated circuit design to increase utilization of the hardware acceleration engine.

* * * * *